United States Patent Office 3,245,793

Patented Apr. 12, 1966

3,245,793

ELEMENTS COMPRISED OF A SILVER HALIDE LAYER IN ASSOCIATION WITH A PHOTOPOLYMERIZABLE LAYER AND PROCESS FOR USE OF SUCH

Charles Walter Smith, Red Bank, N.J., assignor to E. I. du Pont de Nemours and Company, Wilmington, Del., a corporation of Delaware No Drawing. Filed Aug. 1, 1962, Ser. No. 213,854
11 Claims. (Cl. 96—35)

This invention relates to image-forming elements and to a new process for forming images. More particularly, it relates to an improved process for preparing photopolymerized relief printing plates.

The use of photographic processes in the graphic arts or printing field is old and well established. Recently new and more efficient methods have been adopted for making letterpress printing plates. These methods involve the use of photopolymerizable layers and result in polymerized relief images which are quite suitable as printing reliefs.

Photopolymerizable compositions and elements, as described in assignee's patents, Plambeck U.S. 2,720,863 and 2,791,504; Barney U.S. 2,893,868; Martin U.S. 2,902,365; Martin et al. U.S. 2,927,022; Martin U.S. 2,929,710 and Smith U.S. 3,012,952 are useful in the preparation of printing reliefs. These compositions, in addition to other photopolymerizable compositions to be hereinafter described, contain inter alia, addition polymerizable ethylenically unsaturated compounds, e.g., vinylidene and vinyl polymers, preferably of the acrylic or alkacrylic esters type and an addition polymerization initiator activatable by actinic radiation. The photopolymerizable element is exposed, imagewise, e.g., through a separate light stencil, or photographic image-bearing process transparency, to actinic radiation which causes the ethylenically unsaturated compound to photopolymerize and become substantially insoluble in the exposed areas. Following exposure, the element is treated to remove the composition in the unexposed areas but not in the exposed areas. The resulting printing relief is useful directly for printing.

In carrying out the photopolymerization, the photographic transparency is placed in contact with the surface of the photopolymerizable element and while the assembly is in a vacuum printing frame. High vacuum is applied to obtain uniform contact of the transparency with the surface of the photopolymerizable element. The assembled elements are exposed to a source of actinic radiation.

When using a photopolymerizable element as described above with a separate process transparency, difficulties are encountered in maintaining adequate, uniform contact between the negative and the surface of photopolymerizable element. Although, usually, a vacuum of approximately 25 inches is used, the temperatures prevailing during exposure tend to expand entrapped air and vapors evolved from the photopolymerizable composition and this results in poor, non-uniform surface contact. It is also desirable, for technical reasons in obtaining proper relief characteristics, to maintain a partial pressure over the surface of the photopolymerizable element, i.e., a vacuum of the order of 25 inches or less.

An object of this invention is to provide new image-forming elements. Another object is to provide new image-forming elements that give photopolymerized relief images of high fidelity. Another object is to provide such elements which can be prepared in a simple manner and from available materials. A further object is to provide new processes for producing printing reliefs from such elements. Still further objects will be apparent from the following description of the invention.

The new image-forming elements of this invention comprise, in order, (1) A sheet support which can be flexible or rigid, (2) A solid photopolymerizable stratum comprising (a) An addition polymerizable, non-gaseous ethylenically unsaturated compound containing at least one terminal ethylenic group ($CH_2=C<$), having a boiling point above 100° C. at normal atmospheric pressure and being capable of forming a high polymer by free-radical initiated chain propagating addition polymerization, and (b) A preformed, compatible coherent film-forming, macromolecular organic polymer having a molecular weight greater than 10,000 and being solid at 50° C., components (a) and (b) being present in amounts of 10 to 60 and 40 to 90 parts by weight, respectively, (3) A hydrophobic copolymer layer, and (4) A radiation-sensitive, water-permeable colloid-silver halide emulsion layer.

In the foregoing image-forming stratum there may be (c) A free-radical generating addition polymerization initiator activatable by actinic radiation, in an amount from 0.001 to 10 parts by weight of components (a) and (b) and optionally, (d) A thermal addition polymerization inhibitor in an amount from 0.001 to 6 parts by weight of components (a) and (b).

In the image-forming elements just described the hydrophobic copolymer layer (3) may be strongly adherent to the surface of the photopolymerizable stratum (2) and the silver halide emulsion layer (4) or it can be strippable from layer (3). Suitable hydrophobic copolymers for layer (3) are described in and/or defined by the claims of Alles U.S. Patent 2,779,684—Jan. 29, 1957. The vinylidene chloride/acrylic ester/itaconic acid copolymers containing such components in respective amounts by weight, of 35–96%, 3.5–64.5% and 0.5–25%, are especially useful.

In the case where it is desired to mechanically strip the silver halide layer from the photopolymerizable stratum a layer of the copolymers described in Alles U.S. application Ser. No. 795,923 filed Feb. 27, 1959, U.S. Patent 3,043,695, July 10, 1962, and corresponding French Patent 1,250,133 can be used. These vinylidene chloride/unsaturated ester/itaconic acid copolymers can contain such units in the respective amounts, by weight, of 35 to 96%, 3.5 to 40% and 0.5 to 25%. The unsaturated ester as disclosed in said application and patent is selected from the group consisting of methyl, ethyl, propyl and butyl acrylate and methacrylate; acrylontrile; methacrylonitrile and vinyl chloride.

Layer (3) can vary somewhat in thickness but in general is of the same thickness as used in an ordinary photographic film. If the layer is coherent and less than one (1) mil in thickness, that in general will be adequate and the development and fixing of the imagewise-exposed silver halide layer will not affect the surface of the photopolymerizable layer and can be easily peeled off in order not to prevent removal of the unexposed portions of the photopolymerized layer.

The photopolymerizable stratum may vary in thickness but in general has a thickness from 3 to 250 mils. Suitable supports and photopolymerizable layers for the coated elements of this invention are described in the patents identified above. The photopolymerizable elements thereof are provided with the thin hydrophobic copolymer layer and the silver halide emulsion layer described above.

A thin gelatin subbing layer of the conventional type and well known in the photographic manufacturing art may be coated between the copolymeric anchoring layer and the emulsion layer or between the stripping layer and the emulsion layer as described in the above Alles application.

The silver halide emulsion is coated to give a coating weight of about 90 mg./dm.$^2$ of silver halide when dry. Subsequently there may be coated over the colloid silver halide emulsion surface, a thin, anti-abrasion layer as is common in the art. The water-permeable colloid silver halide emulsion layer can be of any type, but preferably is composed of a high contrast silver bromochloride emulsion containing from 30 to 40 mole percent bromide and 70 to 60 mole percent chloride.

The water-permeable silver halide emulsion coatings as well as auxiliary layers, e.g., non-halation, subbing layers, etc. may be applied with the conventional coating machines and dried in a manner well known in the photographic art.

The novel process of this invention comprises exposing, imagewise, the photographic silver halide emulsion layer of the image-forming photopolymerizable elements described above. The element is then developed in a suitable photographic silver halide developer solution and fixed in a conventional silver halide fixing solution. The developer and/or fixing solutions preferably contain relatively large quantities of salts such as magnesium sulfate, sodium sulfite, and sodium sulfate. It has been found that the presence of such salts prevents the separation of the water-permeable colloid silver halide emulsion layer from the photopolymerizable layer during the processing of the silver halide emulsion layer to a silver image-bearing transparency when the element does not contain a hydrophobic copolymer layer as described above. High salt concentrations are unnecessary when the hydrophobic copolymer is employed. The element is then exposed to a radiation source to which the photopolymerizable layer is primarily sensitive and which radiation is modulated by the developed silver in the silver halide layer, the radiation passing through areas with no silver image, After exposure, the hydrophobic copolymer layer and any layer carried thereby is removed and the imagewise photopolymerized layer is subjected to a suitable washout solution, as disclosed in the patents listed above, to remove the unexposed portions of the photopolymerized layer, thereby providing relief printing plates of good quality and fidelity. The thin, water-permeable colloid layers and thin hydrophobic copolymer layers, if the latter are peeled off prior to washout, do not prevent relief image formation and the areas in said layers are removed with the unexposed and unpolymerized adjacent areas of the original photopolymerizable stratum.

The silver halide-coated photopolymerizable elements described above and in the examples given below may be exposed in any conventional manner of making process transparencies from which printing plates are made. Such manners include exposing the element in a process camera or contact printing through a positive or negative. The element is then deveolped in a suitable developer, fixed and dried. The element is then photopolymerized by exposure to an ultraviolet source of radiation to which the photopolymerizable stratum described above is especially sensitive. The element is processed to a relief image by spraying or washing by any other suitable means with an aqueous alkali solution, e.g., 0.04 N sodium hydroxide at about 68° F. to remove the unexposed polymerizable material, usually for a period of about 2–10 minutes. The water permeable colloid layer of the developed silver halide emulsion, where there is no hydrophobic copolymer layer (3) as shown in Example I, washes away along with the unexposed photopolymerizable composition to give a relief printing plate of good quality and fidelity.

Since free-radical generating addition-polymerization initiators activatable by actinic radiation generally exhibit ther maximum sensitivity in the ultraviolet range, the radiaton source should usually furnish an effective amount of this radiation. Both point and broad radiation sources are effective. Such sources include carbon arcs, mercury vapor arcs, fluorescent lamps with ultraviolet radiation-emitting phosphors, argon glow lamps, electronic flash units and photographic flood lamps. Of these, the mercury-vapor arcs, particularly sun lamps are most suitable. The sun lamp mercury-vapor arcs are customarily used at a distance of one and one-half to 24 inches from the photopolymerizable layer. The point sources are generally used at a distance of 20 up to 40 inches from the photopolymerizable element. As stated previously, the photopolymerizable compositions after exposure can be developed, e.g., by impingement of spray jets, etc., including brushing and scrubbing, to the desirable images with aqueous bases, i.e., aqueous solutions of water soluble bases in concentrations generally in the range from 0.01% to 10% by weight. Higher concentrations, of course, can be used, but no improved result is obtained thereby. Depending upon the organic/aqueous base partition solution coefficient of the macromolecular organic polymer derivatives, minor amounts of compatible organic solvents will frequently be found to be efficacious in the relief development medium, e.g., short chain alcohols, e.g., methyl and ethyl alcohol; the ketones, e.g., acetone, ethyl methyl ketone and cyclohexanone.

The invention will now be further illustrated by, but is not intended to be limited to the following examples.

*Example I*

A photopolymerizable composition comprising 30 parts of triethylene glycol diacrylate, 67 parts of cellulose acetate succinate with a degree of acetyl substitution of 1.9 and of succinyl substitution of 0.7, 0.13 part of 2-ethylanthraquinone and 0.13 part of p-methoxyphenol was prepared according to Smith U.S. 3,012,952. This composition was pressed into a sheet of about 20-mil thickness and bonded to an adhesive covered steel plate about 10-mils thick, according to assignee's Burg application Serial No. 750,868, filed July 25, 1958, U.S. Patent 3,036,913, May 29, 1962, to form a photopolymerizable element. Separately, there was prepared a molten lithographic type gelatino-silver halide emulsion comprising 30 mole percent silver bromide and 70 mole percent silver chloride and having 20 grams of gelatin present per mole of silver halide for the steps of precipitating and ripening. After precipitation and ripening, the emulsion was freed of unwanted soluble by-product salts by coagulation and washing in the manner described in Waller et al. U.S. 2,489,341. The silver halide and most of the gelatin was coagulated by commercial sodium lauryl sulfate predominating in sodium dodecyl sulfate, using an acid coagulation environment. Following the washing step, the emulsion coagulum was redispersed in water together with 47 grams of additional gelatin per mole of silver halide. This redispersed emulsion was treated with a conventional non-optical sensitizer and an optical sensitizer to confer sensitivity to green light, was digested at 55° C. to increase sensitivity, was cooled to a temperature at about 38° C. and treated with post-sensitization additives and stabilizers such as additional halides, conventional antifoggants, etc., as is common in the art. Following these additions the emulsion was coated over the above described photopolymerizable surface by pouring. The coating was dried in an oven for two hours at a dry bulb temperature of 85° F. and a wet bulb temperature of 65° F.

The integral element was exposed through a positive transparency and developed for 2½ minutes in a developer having the following composition:

| | |
|---|---|
| Water ml | 500 |
| Sodium sulfite (anhydrous) grams | 30.2 |
| Paraformaldehyde do | 7.5 |
| Sodium bisulfite do | 2.2 |
| Boric acid do | 7.5 |
| Hydroquinone do | 22.5 |
| Potassium bromide do | 1.6 |
| Water to make liter | 1.0 |

The element was rinsed and fixed in a fixer having the following composition:

| | |
|---|---|
| Water ml | 800 |
| Sodium thiosulfate (anhydrous) grams | 127.2 |
| Water to make liter | 1 |

The element was then washed and dried. During fixing, there was some indication of separaton of the developed gelatino-silver halide emulsion layer from the photopolymerizable layer.

The element was then exposed to an ultraviolet source of radiation to give an exposure of 14-watt seconds/square inch. The element was then washed out in a 0.04 N aqueous sodium hydroxide solution at 68° F. for three minutes. The gelatin-emulsion layer washed away without interfering with the washout of the unexposed photopolymerizable composition. At the end of the washout step a relief printing plate of usable quality resulted which was suitable for use on a conventional rotary printing press.

*Example II*

An element was made as described in Example I, except that before the gelatino-silver halide emulsion was coated, the surface of the photopolymerizable layer was coated (1) with an aqueous dispersion of a vinylidene chloride copolymer as described in Example II of assignee's Swindells U.S. Patent 2,698,235, dried and a gelatin subbing layer applied as described in that Example. The gelatino-silver halide emulsion of Example I above was then coated over the subbing layer.

The element was exposed through a process transparency and developed in a developer composed of two parts of water and one part of a solution of the following composition:

| | |
|---|---|
| Water ml | 500 |
| Metol grams | 3.0 |
| Sodium sulfite (anhydrous) do | 45.0 |
| Hydroquinone do | 12.0 |
| Sodium carbonate (anhydrous) do | 67.0 |
| Potassium bromide do | 1.9 |
| Water to make liter | 1.0 |

The element was then rinsed in water and fixed in the fixer composition described in Example I, washed, and dried. There was no evidence of emulsion separation from the photopolymerizable layer. The element was then placed in an inert atmosphere of carbon dioxide for one week in the manner described in assignee's Crawford U.S. Serial No. 787,820 filed January 20, 1959 (abandoned Jan. 9, 1964). The element was then exposed to an ultraviolet radiation source to give an exposure of 10.5 watt-seconds per square inch. The element was then washed with an aqueous solution of 0.04 N sodium hydroxide. The gelatin layer washed off freely but the copolymeric anchoring layer had to be removed by peeling after partial wash-out. After complete washout, a very good quality printing plate was obtained with good printing characters.

*Example III*

An element was made according to Example I of assignee's Alles and Smith U.S. application entitled, "Element and Process," Ser. No. 212,681 filed July 26, 1962, now U.S. Pat. No. 3,186,844. The element was then coated with the gelatino-silver halide emulsion described in Example I above and a contact exposure through a right reading positive transparency. The exposed element was developed for 2½ minutes in the undiluted developer set forth in Example II and fixed in the following composition:

| | |
|---|---|
| Water ml | 800 |
| Sodium thiosulfate (anhydrous) grams | 127.2 |
| Sodium sulfite do | 150.0 |
| Water to make liter | 1.0 |

There was no evidence of separation of the exposed and developed gelatino-silver halide layer and the negative was of good quality.

The photographically processed element was then exposed to ultraviolet radiation to give an exposure of 10.5 watt-seconds per square inch. The unexposed photopolymerizable material of the element was washed out with 0.04 N aqueous sodium hydroxide to produce a relief printing element of good quality. In a rotary press, it produced high quality prints. Essentially no signs of wear of the printing characters could be observed after 10,000 impressions.

*Example IV*

Example III was repeated except that the element was first exposed in a process camera with a halftone screen to a printed page. The element was developed in the silver halide developer set forth in Example III for 1½ minutes, fixed in the fixing composition of that example for 6 minutes, and dried.

Washout of unexposed photopolymerizable material after the ultraviolet exposure took 2½ minutes. A printing element of excellent quality resulted.

The ethylenically unsaturated compound (1) which is capable of polymerizing or forming a high polymer in a short period of time by photo-initiated chain-propagating, addition polymerization can be any of the monomeric compounds disclosed in Plambeck U.S. Patent 2,760,863. Preferably the compounds are non-gaseous at 20° C. and atmospheric pressure, have 1 to 4 or more terminal ethylenic groups, preferably two or more, and have a plasticizing action on the thermoplastic polymer in addition to its other properties disclosed above. Suitable compounds, which may be used alone or in combination, include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022; e.g., those having a plurality of addition polymerizable ethylenic linkages, particularly when present as terminal linkages, and especially those wherein at least one and preferably most of such linkages are conjugated with a doubly bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably of polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetracrylate and tetramethacrylate, 1,3-propanediol diacrylate, 1,5-pentanediol dimethacrylate, the bisacrylates and methacrylates of polyethylene glycols of molecular weight 200–1500, and the like; unsaturated amides, particularly these of the alpha-methylene carboxylic acids, and especially diamines, such as methylene bis-acrylamide, 1,6 - hexamethylene bis - acrylamide, diethylene triamine tris-methacrylamide, bis-(gamma-metacrylamidopropoxy) ethane, beta-methacrylamidoethyl methacrylate, N-(beta-hydroxyethyl)-beta-(methacrylamido) ethyl acrylate and N,N-bis(beta-methacryl - oxyethyl) - acrylamide; vinyl esters such as divinyl succinate, divinyl adipate, divinyl phthalate, divinyl terephthalate, divinyl benzene-1,3-disulfonate, divinyl butane-1, 4-disulfonate; styrene and derivatives thereof and unsaturated aldehydes, such as sorbaldehyde (-hexadienal). An outstanding class of these preferred addition polymerizable compounds are the esters and amides of alpha-methylene carboxylic acids and substituted carboxylic acids with polyols and polyamines wherein the molecular chain between the hydroxyls and amino groups is solely carbon or oxygen interrupted carbon. The preferred monomeric compounds are the di- or poly-functional, but monofunctional monomers can also be used. The amount of the monomer added varies with the particular thermoplastic polymer used.

Suitable binding agents (b) are those in which the free carboxyl groups of the agent are converted into the soluble salt. Such binding agents include cellulose esters made with a dicarboxylic acid, such as the preferred cellulose acetate succinate and the corresponding esters of maleic and glutaric acids as well as the esters of aromatic dicarboxylic acids, e.g., of phthalic acid, tetrahydrophthalic acid, endo-cis-bicyclo (2,2,1)-5-heptene-2,3-dicarboxylic acid. Additional binding agents are:

A polyvinyl alcohol derivative containing lateral free acid (e.g., oxyacid) groups which form soluble salts, more particularly the monovalent alkali metal, ammonium or substituted ammonium or amine salts, which derivative is soluble to the extent of at least 10% by weight in 2% aqueous ammonia solution as disclosed in assignee's Martin U.S. Patent 2,902,365; a cellulose derivative containing lateral free oxyacid groups or oxyacid salt groups where the salt-forming cation is a monovalent alkali metal, e.g., lithium, sodium, potassium, or is an ammonium or substituted ammonium radical, which is soluble to the extent of at least 10% by weight in 1% aqueous ammonia solution and may contain as inert ingredients up to 35% by weight of inert organic of inorganic filler material as disclosed in assignee's Martin and Barney U.S. Patent 2,927,022.

Present in the preferred photopolymerizable compositions are photoinitiators (c) preferably those activatable by actinic light and thermally inactive at and below 185° C. which include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 3-chloroanthraquinone, 2-methylanthraquinone, 2-ethyl-anthraquinone, 2-tert-butylanthraquinone, octamethylanthraquinone, 1,4 - naphthoquinone, 9,10-phenanthrenequinone, 1,2-benzanthraquinone, 2,3-benzanthraquinone, 2-methyl-1,4 - naphthoquinone, 2,3 - dichloronaphthoquinone, 1,4 - dimethylanthraquinone, 2,3-dimethylanthraquinone, 2-phenylanthraquinone, 2,3 - diphenylanthraquinone, 2 - phenylanthraquinone, 2,3 - diphenylanthraquinone, sodium salt of anthraquinone alphasulfonic acid, 3-chloro-2-methylanthraquinone, retenequinone, 7,8,9,10-tetrahydronaphthacenequinone, and 1,2,3, 4-tetrahydro(a)anthracene-7,12-dione. Certain aromatic ketones, e.g., benzophenone, are also useful as are the following photoinitiators, some of which may be thermally active at temperatures as low as 85° C., e.g., those described in Plambeck U.S. Patent 2,760,863 and include vicinal ketaldonyl compounds, such as diacetyl, benzil, etc., alpha-ketaldonyl alcohols, such as benzoin, pivaloin, etc.; acyloin ethers, e.g., benzoin methyl and ethyl ethers, etc.; alpha-hydrocarbon substituted aromatic acyloins, including alpha-methylbenzoin, alpha-allylbenzoin, and alpha-phenylbenzoin. Silver persulfate is also useful as free-radical generating initiators activatable by actinic radiation, as are the azo initiators disclosed in assignee's Burg applications Serial Nos. 156,529 and 156,530, now U.S. Patent No. 3,192,194, filed December 1, 1961.

Thermal polymerization inhibitors (d) are also present in the preferred compositions, including p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloroanil.

At least one stratum and preferably two of the photopolymerizable composition is coated on a base support. Suitable bases or supports include those disclosed in U.S. Patent 2,760,863, metals, cellulose esters, e.g., cellulose acetate, cellulose propionate, cellulose butyrate, etc., and other plastic compositions such as polyamides, polyesters, e.g., polyethylene terephthalate, etc. The support may have in or on its surface and beneath the outer photopolymerizable stratum, an antihalation layer as disclosed in said patent or other substrata needed to facilitate anchorage to the base, e.g., the adhesive compositions disclosed in the Burg application noted above.

As previously described, the invention is also useful with photopolymerizable elements containing more than one stratum of photopolymerizable composition as disclosed in Plambeck U.S. Patent 2,964,401; Crawford U.S. Patent 2,993,780; and assignee's Notley application Serial No. 788,501, filed January 23, 1959 now U.S. Pat. No. 3,157,505.

The water-permeable colloid silver halide emulsions which may be used in the element of the invention are not limited to gelatino-silver bromochloride lithographic emulsions. There may be other types of gelatino-silver halide emulsions, e.g., silver iodobromide emulsions for radiology and other uses, silver bromide and silver chloride types. The gelatino-silver halide emulsions may contain such agents as polyvinyl pyrrolidone, dextrin, dextran and/or other such agents which increase the covering power of the developed silver.

In place of all or part of the gelatin used in the above examples, there can be substituted other natural or synthetic water permeable organic colloid binding agents. Such agents include water-soluble or water permeable polyvinyl alcohol and its derivatives, e.g., partially hydrolyzed polyvinyl acetates, polyvinyl ethers, and acetals containing a large number of extralinear —$CH_2CHOH$— groups; hydrolyzed interpolymers of vinyl acetate and unsaturated addition polymerizable compounds such as maleic anhydride, acrylic and methacrylic acid ethyl esters, and styrene. Suitable colloids of the last mentioned type are disclosed in U.S. Patents 2,276,322; 2,276,323; and 2,397,866. Useful polyvinyl acetals include polyvinyl acetaldehyde acetal, polyvinyl butyraldehyde acetal and polyvinyl sodium o-sulfobenzaldehyde acetal. Other useful colloid binding agents include the hydrophilic copolymer of N-acrylamido alkyl betaines described in Shacklett, U.S. Patent 2,833,650 and hydrophilic cellulose ethers and esters. Further the emulsions may contain quantities of water-insoluble latex particles, e.g., acrylic and methacrylic ester polymers and copolymers, butadiene/styrene copolymers, etc.

The silver halide emulsions may contain any of the well-known optical sensitizing dyes such as cyanines, carbocyanines, merocyanines etc., as well as non-optical sensitizers such as sulfur sensitizers containing labile sulfur, e.g., allyl isothiocyanate, allyl diethyl thiourea, phenyl isothiocyanate and sodium thiosulfate, the polyoxyalkylene ethers of Blake et al. U.S. Patent 2,400,532 and the polyglycols disclosed in Blake et al. U.S. Patent 2,432,549. Other non-optical sensitizers such as amines as taught by Staud et al. U.S. Patent 1,925,508 and metal salts as taught by Baldsiefen U.S. Patent 2,540,085 and Baldsiefen et al. U.S. 2,540,086 may also be used. Antifoggants, e.g., benzotriazole and triazaindenes, can be used as well as the usual hardeners, i.e., chrome alum formaldehyde, etc. Other emulsion adjuvants well known in the art may be added, e.g., matting agents, plasticizers, optical brightening agents, etc. By selection of appropriate emulsions and sensitizers the silver halide layer may be exposed by radiation both in the visible and invisible regions of the spectrum, e.g., ultra-violet, infrared, X-ray etc.

Suitable bases for processing the exposed photopolymerizable element include alkali metal hydroxides, e.g., lithium, sodium and potassium hydroxide; the base reacting alkali metal salts of weak acids, e.g., lithium, sodium, and potassium carbonates and bicarbonates; amines having a base-ionization constant greater than about $1\times10^{-6}$, e.g., primary amines, e.g., benzyl, butyl, allyl amines, and the like; secondary amines, e.g., dimethylamine and benzyl methyl amine; tertiary amines, e.g., trimethylamine, and triethylamine; primary, secondary, and tertiary hydroxylamines, e.g., propanol, diethanol and triethanol amine, and 2-amino-2-hydroxymethyl-1,3-propanediol, cyclic amines, e.g., morpholine, piperidine, piperazine, pyrrolidone, and pyridine, polyamines, such as hydrazine, ethylene and hexamethylene amines; the water-soluble, base-reacting, salts, e.g., the carbonates and bicarbonates of the above amines; ammonium hydroxide and tetrahydrocarbon-substituted ammonium hydroxides, e.g., tetramethyl-, tetraethyl; trimethyl, benzyl, and trimethylphenyl, ammonium hydroxides; sulfonium hydroxides, e.g., trimethyl; diethylmethyl; and dimethylbenzylsulfonium hydroxides and the base reacting soluble salts thereof, e.g., the carbonates, bicarbonates and sulfides; alkali metal phosphates and pyrophosphates, e.g., sodium and potassium triphosphates and sodium and potassium pyrophosphates. For reasons of greater availability, ease and handling and low costs, the preferred bases are the alkali metal hydroxides, particularly sodium and potassium hydroxides; ammonium hydroxides; the alkali metal base-reacting salts of weak acids, especially sodium and potassium bicarbonate, and carbonate; and the hydroxylamines.

It will be obvious that the process of preparing printing plates according to this invention is much less costly and time consuming. It will also be seen that the problem of maintaining the necessary highly intimate contact between the surface of the photopolymerizable element and the negative transparency has been obviated and that it is unnecessary to use a high vacuum printing frame to effect exposure of the photopolymerizable element as practiced by the prior art.

The process is not limited to making relief printing plates for letterpress printing but it may also be used to make printing plates for lithographic and gravure printing presses. The process of this invention may also be used for duplicating existing plates. For example, the element may be exposed to a printed proof pulled from a metal printing form and processed as described above.

Another advantage of the invention is that the invention eliminates the steps of making a separate image-bearing transparency and applying it to the surface of a photopolymerizable element.

I claim:

1. An image-forming element which comprises, in order, (1) a sheet support, (2) a solid photopolymerizable stratum comprising (a) an addition polymerizable, non-gaseous ethylenically unsaturated compound containing at least one terminal ethylenic group ($CH_2{=}C<$), having a boiling point above 100° C. at normal atmospheric pressure and being capable of forming a high polymer by free-radical initiated chain propagating addition polymerization, and (b) a preformed, compatible coherent film-forming, macromolecular organic polymer having a molecular weight greater than 10,000 and being solid at 50° C., components (a) and (b) being present in amounts of 10 to 60 and 40 to 90 parts by weight, respectively, (3) a hydrophobic copolymer layer, and (4) a radiation-sensitive, water-permeable colloid-silver halide emulsion layer.

2. An element according to claim 1 wherein the support is a rigid polyester film support.

3. An element according to claim 1 wherein the support is a flexible metal support.

4. An element according to claim 1 wherein the macromolecular organic polymer is a cellulose acetate hydrogen succinate.

5. An element according to claim 1 wherein the macromolecular organic polymer is a cellulose acetate hydrogen maleate.

6. An element according to claim 1 wherein said hydrophobic copolymer is a vinylidene chloride/unsaturated ester/itaconic acid copolymer wherein said unsaturated ester is an ester selected from the group consisting of methyl, ethyl, propyl and butyl arcrylates; methyl, ethyl, propyl and butyl methacrylates; acrylonitrile, methacrylonitrile and vinyl chloride; said copolymer containing said constituents in the respective amounts, by weight, of 35–96%, 3.5–64.5% and 0.5–25%.

7. An element according to claim 1 wherein said hydrophobic copolymer is a vinylidene chloride/acrylic ester/itaconic acid copolymer containing said constituents in the respective amounts, by weight, of 35–96%, 3.5–40.0% and 0.5–25%.

8. A process which comprises exposing, imagewise, to light an element comprising, in order, (1) a sheet support comprising (a) an addition polymerizable, non-gaseous ethylenically unsaturated compound containing at least one terminal ethylenic group ($CH_2{=}C<$), having a boiling point above 100° C. at normal atmospheric pressure and being capable of forming a high polymer by free-radical initiated chain propagating addition polymerization, and (b) a preformed, compatible coherent film-forming, macromolecular organic polymer having a molecular weight greater than 10,000 and being solid at 50° C., components (a) and (b) being present in amounts of 10 to 60 and 40 to 90 parts by weight, respectively, and (3) a radiation-sensitive, water-permeable colloid-silver halide emulsion layer, developing and fixing the exposed silver halide emulison layer in developer and fixer solutions that contain large quantities of an inorganic salt selected from the group consisting of magnesium sulfate, sodium sulfite and sodium sulfate, exposing the resulting element to actinic radiation until the exposed areas of the photopolymerizible stratum are polymerized without polymerization in unexposed areas and removing the emulsion layer and unexposed portions of said stratum to form a printing relief.

9. A process which comprises exposing, imagewise, to light an element as defined in claim 1, developing and fixing the exposed silver salt, exposing the resulting element to actinic radiation until the exposed areas of the photopolymerizible stratum are polymerized without polymerization in unexposed areas and removing the hydrophobic copolymer layer, emusion layer and unexposed portions of said stratum to form a printing relief.

10. A process according to claim 9 wherein the silver image layer is removed after the polymerization exposure but before removal of the unexposed areas.

11. An element according to claim 1 wherein the organic polymer of component (b) contains free oxyacid groups and the hydrophobic copolymer layer is coherent and not more than 1 mil in thickness.

(References on following page)

References Cited by the Examiner

UNITED STATES PATENTS

| | | | |
|---|---|---|---|
| 2,607,684 | 8/1952 | Nowak et al. | 96—68 |
| 2,684,341 | 7/1954 | Anspon et al. | 96—68 |
| 2,725,296 | 11/1955 | Kendall | 96—69 |
| 2,760,863 | 8/1956 | Plambeck. | |
| 2,875,054 | 2/1959 | Griggs et al. | 96—1 |
| 2,900,255 | 8/1959 | Charlton | 96—68 |
| 2,902,365 | 9/1959 | Martin. | |
| 2,951,758 | 9/1960 | Notley | 96—35 |
| 2,977,227 | 3/1961 | De Maria | 96—36 X |
| 3,012,952 | 12/1961 | Smith | 96—35 |
| 3,038,800 | 6/1962 | Luckey et al. | 96—35 |
| 3,043,695 | 7/1962 | Alles | 96—83 |
| 3,053,745 | 9/1962 | Levinos | 96—35 |
| 3,055,758 | 9/1962 | McDonald | 96—1 |

NORMAN G. TORCHIN, *Primary Examiner*.